(12) United States Patent
Oita

(10) Patent No.: US 6,756,863 B2
(45) Date of Patent: Jun. 29, 2004

(54) HIGH-FREQUENCY OSCILLATOR OF FREQUENCY SWITCHING TYPE AND HIGH-FREQUENCY OSCILLATION METHOD

(75) Inventor: Takeo Oita, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/140,756

(22) Filed: May 7, 2002

(65) Prior Publication Data

US 2002/0171511 A1 Nov. 21, 2002

(30) Foreign Application Priority Data

May 8, 2001 (JP) ........................................ 2001-137574

(51) Int. Cl.[7] .............................. H03H 9/70; H03H 9/54; H03H 9/64; H03B 5/32
(52) U.S. Cl. ........................ 333/133; 333/193; 333/188; 331/77; 331/116 R; 331/107 A; 331/158; 331/162; 331/177 R
(58) Field of Search .......................... 333/133, 193–196, 333/186–188; 331/77, 116 R, 107 A, 154, 158, 162, 177 R, 179

(56) References Cited

U.S. PATENT DOCUMENTS

| 4,105,949 A | 8/1978 | Hardin ........................ 331/37 |
| 4,134,085 A | 1/1979 | Driscoll et al. ......... 331/116 R |
| 4,379,274 A | 4/1983 | Hansen ........................ 333/194 |
| 4,516,085 A * | 5/1985 | Effinger et al. ............... 331/40 |
| 4,733,122 A | 3/1988 | Shinonaga et al. ..... 310/313 R |
| 5,016,260 A * | 5/1991 | Masuda ........................ 375/66 |
| 5,332,983 A | 7/1994 | Peach .......................... 333/193 |
| 6,005,446 A * | 12/1999 | Galani et al. .................. 331/41 |
| 6,028,885 A | 2/2000 | Minarik et al. ............. 375/202 |
| 6,549,083 B2 * | 4/2003 | Kanazawa et al. ............ 331/76 |

FOREIGN PATENT DOCUMENTS

| EP | 898363 A2 | 2/1999 |
| JP | 1-200723 | 8/1989 |
| JP | 2000-59176 | 2/2000 |

* cited by examiner

Primary Examiner—Barbara Summons
(74) Attorney, Agent, or Firm—Greer, Burns & Crain, Ltd.

(57) ABSTRACT

An oscillator of frequency switching type according to the present invention is adapted to select and output any of a plurality of high frequencies. The oscillator of frequency switching type includes a plurality of crystal oscillators whose fundamental frequencies are different, and filters a signal output from the operating crystal oscillator with a SAW filter configured by forming a plurality of IDTs, which set passbands of different frequencies, on the same piezoelectric substrate, or with a filter arranged for each frequency of the corresponding crystal oscillator.

14 Claims, 7 Drawing Sheets

HIGH-FREQUENCY OSCILLATOR OF FREQUENCY SWITCHING TYPE AND HIGH-FREQUENCY OSCILLATION METHOD

BACKGROUND OF THE INVENTION

1. Field of the Invention

The present invention relates to a high-frequency oscillator, and more particularly, to a high-frequency oscillator of a frequency switching type(hereinafter referred to as an oscillator of a frequency switching type), which can switch among a plurality of high frequencies and output a signal.

2. Description of the Related Art

A high-frequency oscillator that outputs a 600-MHz or higher frequency by using a crystal resonator with high stability is used as a frequency source, etc. of an optical communication. The high-frequency oscillator normally amplifies the output of a crystal oscillator with frequency multiplication, for example, by using a plurality of LC filter stages and an amplifier, and obtains a target high-frequency output.

In recent years, instead of this configuration, a high-frequency oscillator having a configuration where a high-frequency output is obtained by distorting the output of a crystal oscillator, and by selecting a harmonic component with a SAW (Surface Acoustic Wave) filter has been implemented, for example, as recited in Japanese Patent Application No. 2000-244682. With this configuration, the number of elements is decreased, so that the outer dimensions of the oscillator are significantly reduced.

FIG. 1 is a circuit diagram of a high-frequency oscillator having such a configuration.

The high-frequency oscillator shown in this figure is configured by a crystal oscillator 1, a SAW filter 2, and an amplifier 3. The crystal oscillator 1 is composed of a crystal unit 4 which is, for example, AT-cut, a split capacitor which is not shown and forms a resonant circuit along with the crystal unit 4, and an oscillation amplifier 5 which feeds back and amplifies a resonant frequency. Here, what is called an oscillation circuit of a colpitts type is formed.

The SAW filter 2 is configured by forming, for example, input/output interdigital transducers (IDTs) on a piezoelectric substrate not shown. The SAW filter 2 makes only a component in a particular frequency region of an input signal pass through, and outputs the component.

The amplifier 3 is implemented as a broadband amplifier 3 such as a linear IC amplifier, etc. With the amplifier 3, the output of the SAW filter 2 is amplified with a linear portion, namely, a non-saturation portion of the input/output characteristic of the broadband amplifier 3, so that a high-frequency output is obtained.

The crystal oscillator 1 referred to here is a voltage controlled type implemented by inserting a voltage variable capacitance element 6 in an oscillation closed loop of the crystal oscillator 1. The oscillation frequency of the crystal oscillator 1 is varied by a control voltage Vc that is applied via a high-frequency blocking resistor 7. Additionally, Vcc in FIG. 1 is a power source voltage. Generally, a complementary-output driver IC 8 is connected to the amplifier 3.

In the high-frequency oscillator shown in FIG. 1, the oscillation output of the crystal oscillator 1 is distorted. For example, the top of a sinusoidal wave is cut and distorted to be rectangular as shown in FIG. 2 by making a center voltage Voo of the oscillation output higher than a center voltage Vco of the power source voltage Vcc. The oscillation output of the crystal oscillator 1 is distorted in this way, so that the levels of harmonic components f2 through fn, relative to a fundamental component f1 within a frequency spectrum, are raised in the oscillation output as shown in FIG. 3. In FIG. 2, only the top of the sinusoidal wave is distorted to be rectangular. However, the top and the bottom of the sinusoidal wave may be distorted to be rectangular, for example, by increasing the amplification rate of the oscillation amplifier 5.

The respective components of the frequency spectrum are made equal to or higher than a predetermined level as shown in FIG. 3, whereby an arbitrary harmonic component can be selected by inputting this oscillation output to the SAW filter 2. For example, the fundamental frequency (fundamental component) f1 of the crystal oscillator 1 is implemented to be 155.52 MHz, which is almost as high as the manufacturing limit of the crystal oscillator 1, and a harmonic component 622.08 MHz, which becomes a quadruple-frequency wave f4, is selected with the SAW filter 2, and amplified with the amplifier 3, so that a high-frequency output is obtained. If the oscillation output of the crystal oscillator 1 is not distorted, the level of a harmonic component relative to the fundamental component is low. Therefore, the harmonic component cannot be selected with the SAW filter 2.

However, with the high-frequency oscillator having the above described configuration, only a signal of one high frequency, for example, only a signal of 622.08 MHz can be output. Accordingly, if a communications appliance requires, for example, signals of 2 frequencies such as 622.08 MHz and 666.5143 MHz, two high-frequency oscillators, each of which comprises a crystal oscillator 1, a SAW filter 2, and an amplifier 3 must be mounted on a set substrate for each of the frequencies, and an output signal from either of the oscillators must be selected and used. Accordingly, the configuration of the high-frequency oscillator becomes large in this case, leading to an increase in the cost, and an obstacle to the downsizing of the set substrate.

SUMMARY OF THE INVENTION

An object of the present invention is to provide an oscillator of a frequency switching type, which can select and output any of a plurality of high frequencies, and can reduce a device in size.

An oscillator of a frequency switching type according to the present invention comprises a plurality of crystal oscillation units, a power switching unit, and a SAW filter unit.

The plurality of crystal oscillation units respectively have oscillation outputs whose fundamental frequencies are different.

The power switching unit operates one of the plurality of crystal oscillation units.

The SAW filter unit is implemented by forming a plurality of IDTs (Inter Digital Transducers), which set passbands of different frequencies, on the same piezoelectric substrate. To the SAW filter, the above described oscillation output of the crystal oscillation unit that is operated by the power switching unit is input.

An oscillator of a frequency switching type having another configuration according to the present invention comprises a plurality of crystal oscillation units having oscillation outputs whose fundamental frequencies are different, a plurality of filter units, which are respectively arranged for the plurality of crystal oscillation units and whose frequency passbands are different, and an output frequency selection unit selecting a frequency of a high-frequency output that is output from the high-frequency oscillator.

The plurality of filter units is a SAW filter which is configured by forming a plurality of IDTs, which set, by way of example, passpands of different frequencies, on the same piezoelectric substrate.

The output frequency selection unit selects the frequency a high-frequency output, which is ouput from the high-frequency oscillator, by supplying power to one of the plurality of crystal oscillation units.

The plurality of crystal oscillation units distort and output the oscillation output.

An oscillator of a frequency switching type having a further configuration according to the present invention comprises a crystal oscillation unit distorting and outputting an oscillation output, a plurality of filter units whose frequency passbands are different, and an input selection unit selecting one of the plurality of filter units, and inputting the oscillation outputs.

According to the present invention, a plurality of high-frequency signals can be selected and output. Additionally, a device can be downsized by reducing a plurality of filters in size.

DESCRIPTION OF THE PREFERRED EMBODIMENTS

Figure 4:
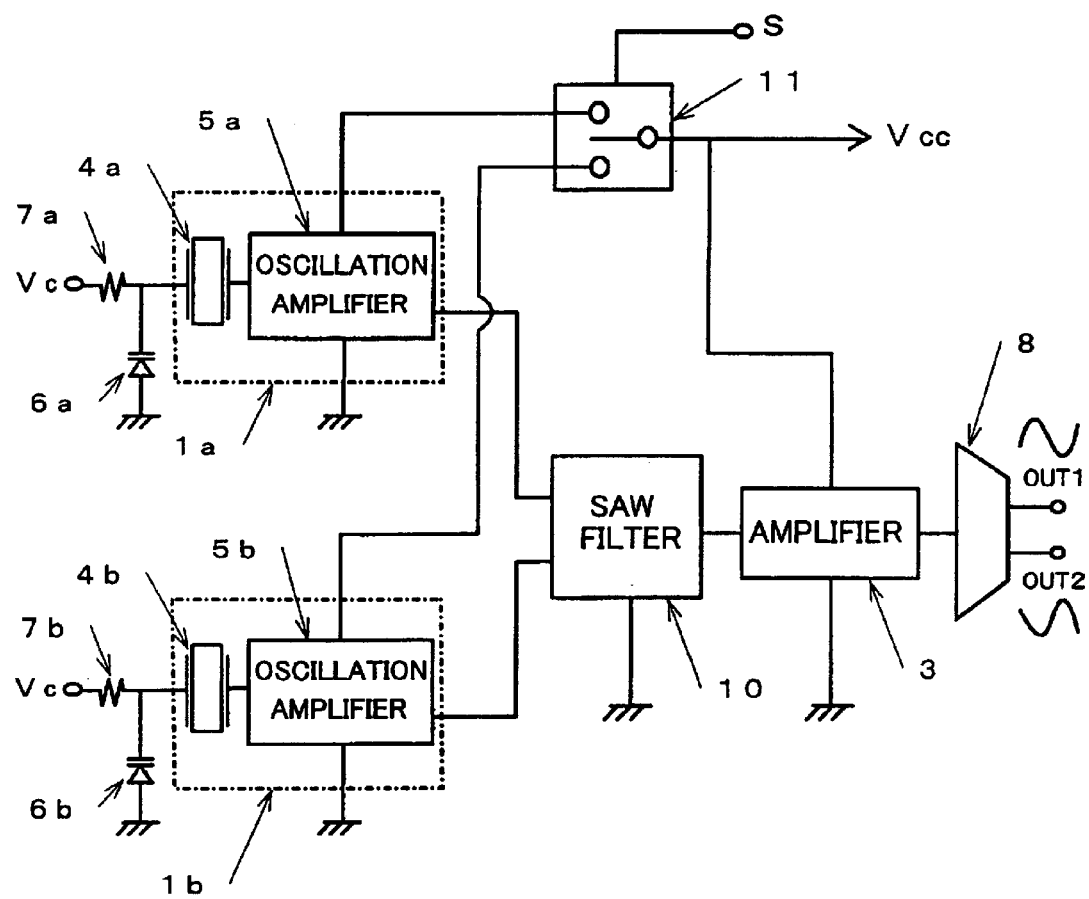
FIG. 4 is a circuit diagram showing the configuration of an oscillator of a frequency switching type according to a first preferred embodiment.

FIG. 4 is a circuit diagram showing the configuration of an oscillator of a frequency switching type according to the first preferred embodiment of the present invention.

The oscillator of a frequency switching type according to the first preferred embodiment comprises a plurality of crystal oscillators whose fundamental frequencies are different. This oscillator operates any of the plurality of crystal oscillators, and filters a harmonic component of the operating crystal oscillator with a SAW filter that is configured by forming a plurality of IDTs, which set passbands of different frequencies, on the same piezoelectric substrate.

The configuration shown in FIG. 4 selects and outputs two different high-frequency signals, and comprises two crystal oscillators. In this figure, a first crystal oscillator 1a, a second crystal oscillator 1b, an amplifier 3, crystal units 4 (4a and 4b), oscillation amplifiers 5 (5a and 5b), voltage-variable capacitance elements 6 (6a and 6b), high-frequency blocking resistors 7 (7a and 7b), and a complementary-output driver IC 8 fundamentally have the same functions as those of the constituent elements denoted with the same reference numerals in FIG. 1. Their explanations are therefore simplified or omitted below.

The oscillator of a frequency switching type shown in FIG. 4 comprises first and second crystal oscillators of a voltage control type 1a and 1b, a SAW filter 10, an amplifier 3, a complementary-output driver IC 8, and a power switching unit 11. These elements are mounted on a circuit board not shown, and collectively accommodated within an oscillator case.

Figure 3:
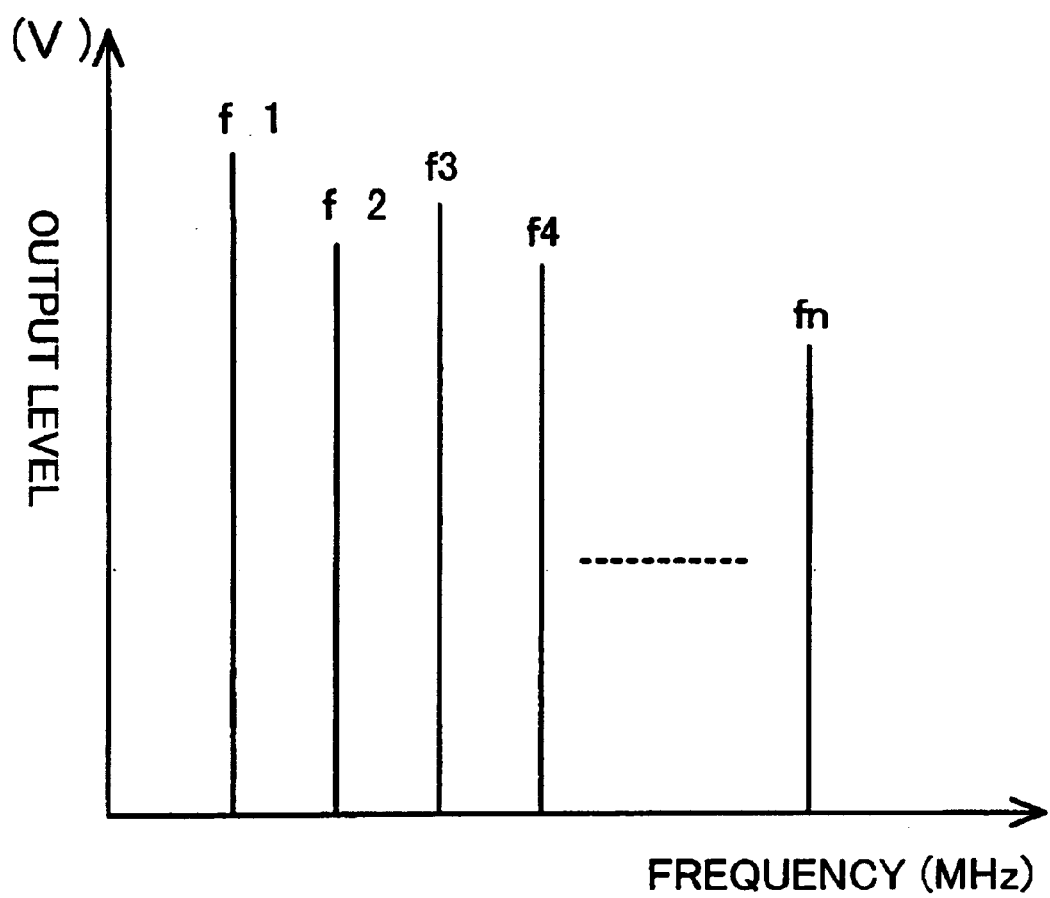
FIG. 3 shows the frequency spectrum of the oscillation output.

The oscillator of a frequency switching type shown in FIG. 4 comprises two crystal oscillators 1 respectively having crystal unit 4 whose fundamental frequencies are different. The first and the second crystal oscillators 1a and 1b distort an oscillation output as shown in FIG. 3, and output a signal whose harmonic component level is increased relatively to the fundamental component. The first and the second crystal oscillators 1a and 1b respectively have different fundamental frequencies. Here, assume that the oscillation frequencies of the first and the second crystal oscillators 1a and 1b are respectively 155.52 MHz (hereinafter referred to as a first oscillation frequency), and 166.628575 MHz (hereinafter referred to as a second oscillation frequency).

The oscillator of a frequency switching type shown in FIG. 4 comprises the power switching unit 11. This power switching unit 11 selects and supplies a power line Vcc to one of the first and the second crystal oscillators 1a and 1b based on a selection signal S from a selection switching mechanism not shown. In this way, only one of the first and the second crystal oscillators 1a and 1b is selected based on the selection signal S, and operated. As a result, an electric mutual interference, for example, between the oscillation amplifier 5a of the first crystal oscillator 1a and the oscillation amplifier 5b of the second crystal oscillator 1b, etc. can be prevented to avoid the cross talk, so that phase noise can be further reduced.

The SAW filter 10 has a configuration where two sets of IDTs, which set passbands of 622.08 MHz and 666.5143 MHz that are quadruple-frequency waves of the first and the second oscillation frequencies, are formed on the same piezoelectric substrate.

Figure 5:
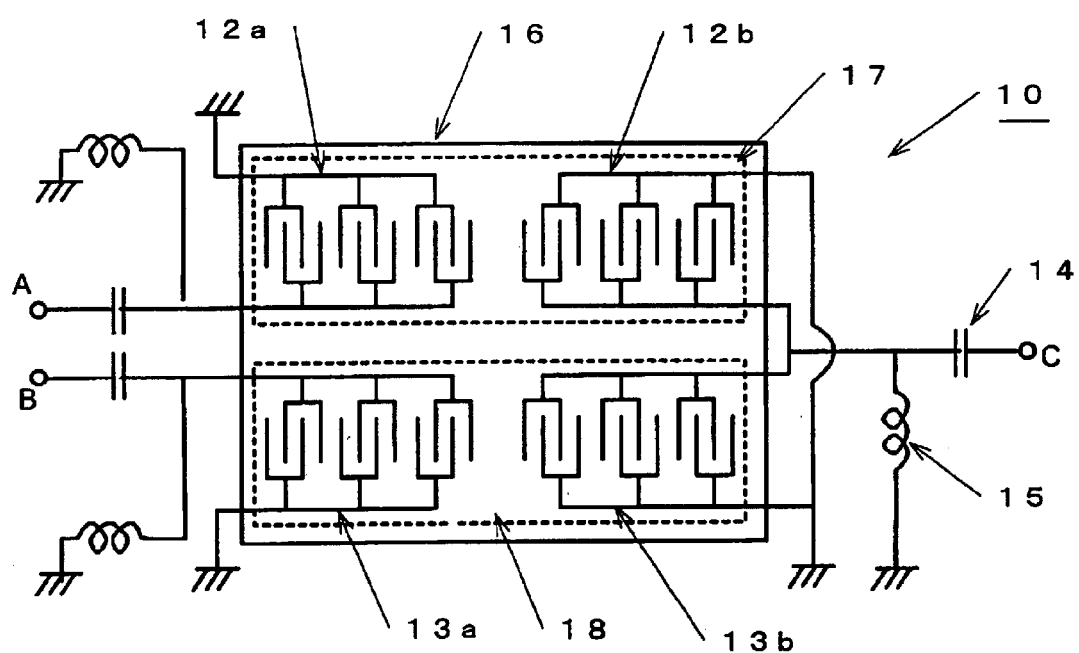
FIG. 5 is a top view schematically showing the configuration of a SAW filter in the first preferred embodiment.

FIG. 5 exemplifies the configuration of the SAW filter 10 shown in FIG. 4.

The SAW filter 10 shown in this figure has a configuration where a pair of two sets of IDTs 12 (12a and 12b) and 13 (13a and 13b) for transmission/receiver are arranged in parallel in FIG. 5 on a piezoelectric substrate 16. The pair of two sets of IDTs 12 and 13 respectively form first and second filters 17 and 18. An input end A of the first filter 17, and an input end B of the second filter 18 are respectively connected to an output of the first crystal oscillator 1a, and an output of the second crystal oscillator 1b. Additionally, the outputs of the first and the second filters 17 and 18 are connected in common as one output end C.

Center frequencies in the passbands of the first and the second filters 17 and 18 are respectively set to 622.08 MHz and 666.5143 MHz, which are quadruple-frequency waves of the first oscillation frequency 155.52 MHz and the second oscillation frequency 166.628575 MHz.

A capacitor 14 and an inductor 15 in FIG. 5 are a capacitor and an inductor for impedance matching. The piezoelectric substrate 16 on which the first and the second filters 17 and 18 are formed is hermetically sealed within a surface mounting housing.

Once the oscillator of a frequency switching type shown in FIG. 4 is mounted on a set substrate, for example, of a communications appliance, a frequency to be oscillated, namely, the crystal oscillator 1 to which a power source is to be supplied is selected based on the switching signal S input from the selection switching mechanism. Then, for example, if the first oscillation frequency 155.52 MHz is selected as an output frequency, a power source is supplied by the power switching unit 11 to the oscillation amplifier 5a of the crystal oscillator 1a, and a signal whose fundamental frequency is the first oscillation frequency 155.52 MHz is output from the first crystal oscillator 1a. This signal passes through the first filter 17 of the SAW filter 10, which is connected to the first crystal oscillator 1a and whose passband is 622.08 MHz, so that a required 622.08 MHz harmonic component is obtained. After this component is amplified with the amplifier 3, complementary outputs OUT1 and OUT2 are obtained via the complementary-output driver IC 8.

With such a configuration, a high frequency 622.08 MHz or 666.5143 MHz, which is selected with the SAW filter 10 from the harmonic components of the first and the second crystal oscillators 1a and 1b, can be securely obtained as an output.

Additionally, the first and the second filters 17 and 18, whose passbands are different, are formed on the same piezoelectric substrate 16, and hermetically sealed within a surface mounting housing and shared. Therefore, the mounting area can be reduced in comparison with the case of using a SAW filter where the first and the second filters 17 and 18 are hermetically sealed within separate housings.

Furthermore, in the example of this oscillator of a frequency switching type, the outputs of the first and the second filters 16 and 17 are connected in common as one output of the SAW filter 10, and the amplifier 3 and the driver IC 8 are shared. Accordingly, the device can be further downsized in comparison with the case of using a configuration where two high-frequency oscillators are used to respectively accommodate the outputs of the first and the second filters 16 and 17.

Figure 6:
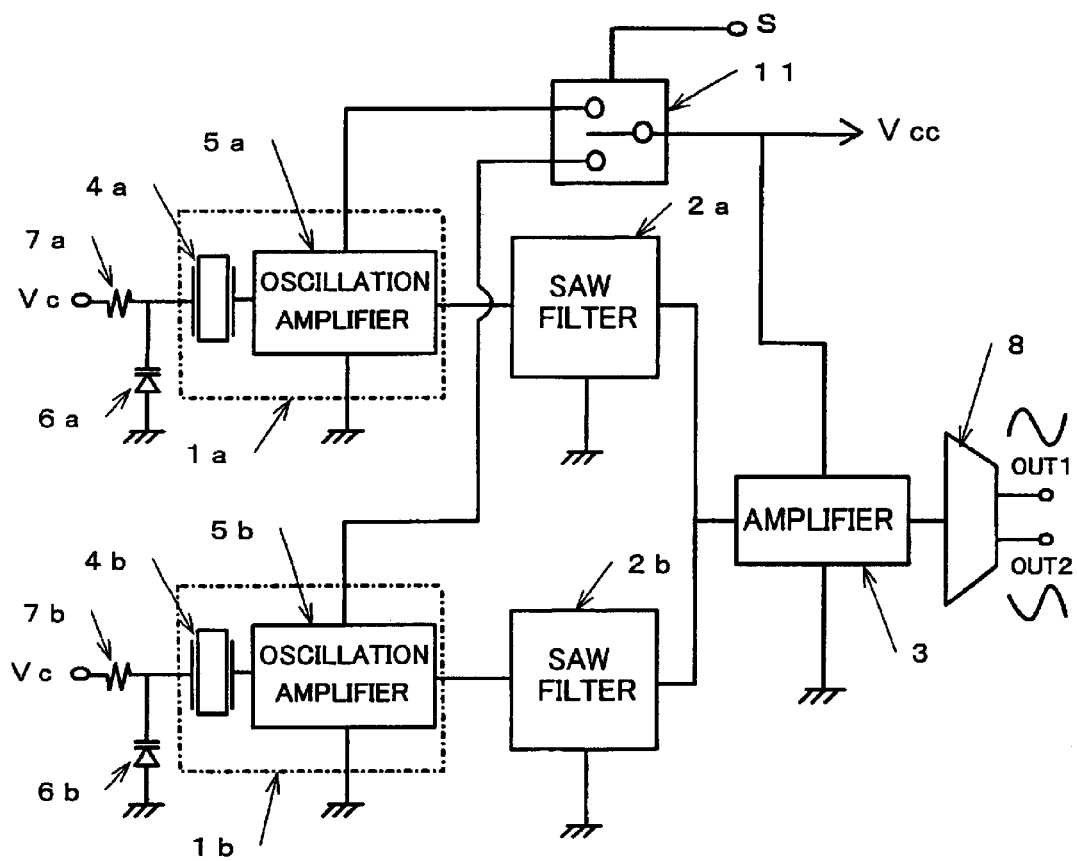
FIG. 6 is a circuit diagram showing the configuration of an oscillator of a frequency switching type according to a second preferred embodiment.

FIG. 6 is a circuit diagram showing the configuration of an oscillator of a frequency switching type according to the second preferred embodiment. In this figure, constituent elements that fundamentally have the same functions as those of the constituent elements shown in FIGS. 1 and 4 are denoted with the same reference numerals, and their explanations are simplified or omitted below.

Figure 1:
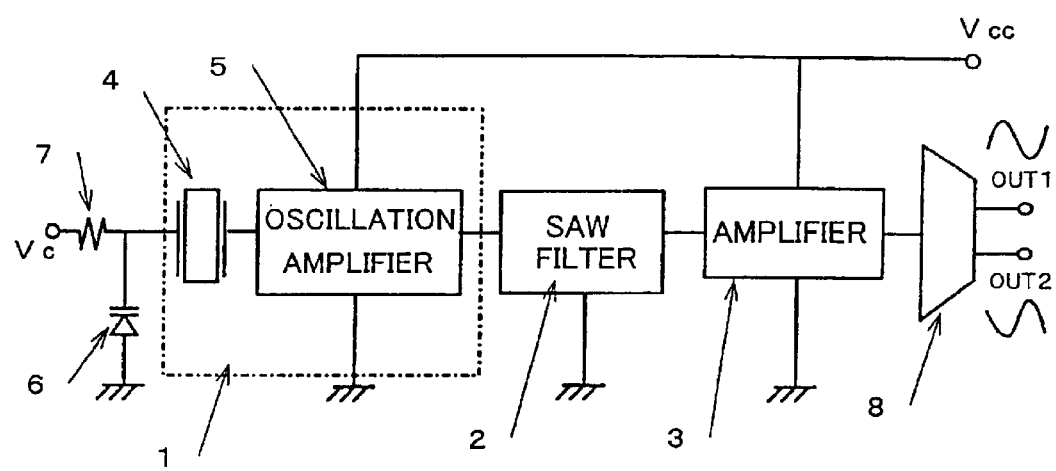
FIG. 1 is a circuit diagram showing the configuration of a high-frequency oscillator that obtains a high frequency output by distorting the output of a crystal oscillator, and by selecting a harmonic component with a SAW filter.
Figure 2:
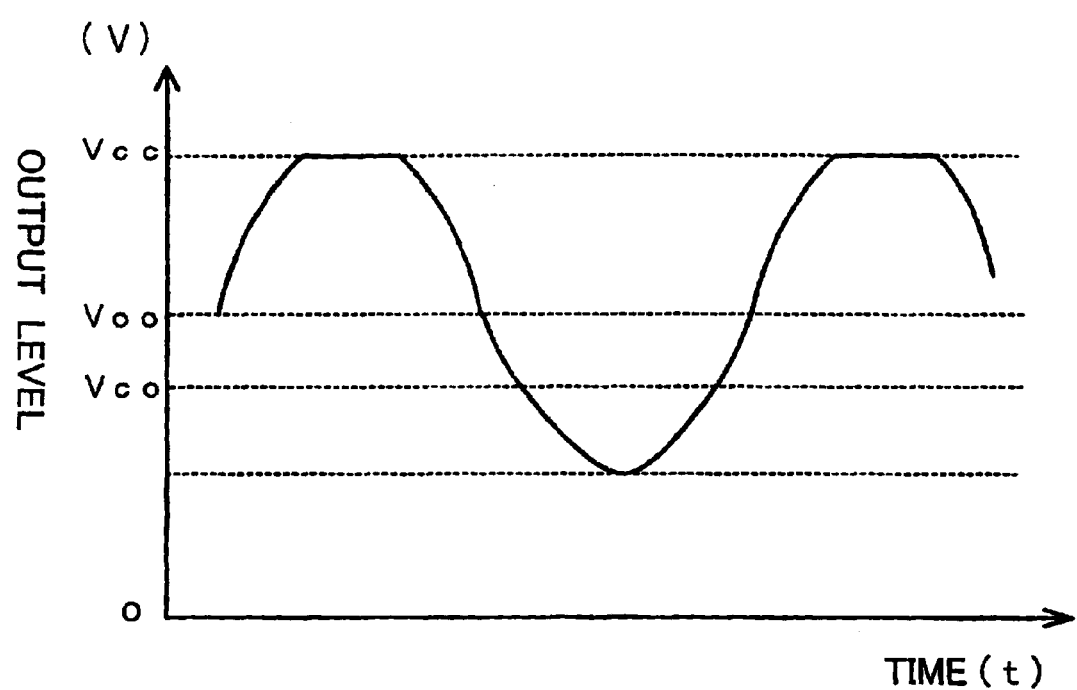
FIG. 2 shows the waveform of the oscillation output of the crystal oscillator.

The oscillator of a frequency switching type shown in FIG. 6 has a configuration where SAW filters 2a and 2b shown in FIG. 1, whose center frequencies of passbands are the fundamental component f1 or the harmonic components f2 to fn of the output of each crystal oscillator 1, are respectively arranged for the first and the second crystal oscillators 1a and 1b having different fundamental frequencies.

Similar to the configuration shown in FIG. 4, the power switching unit 11 selects and supplies the power line Vcc to one of the first and the second crystal oscillators 1a and 1b based on the switching signal S from the selection switching mechanism not shown, so that an output signal of the frequency that is set by the SAW filter 2a or 2b can be securely obtained also in this configuration. Furthermore, the outputs of the SAW filters 2a and 2b are connected in common as one output, and the amplifier 3 and the driver IC 8 are shared, so that the device can be downsized in comparison with the configuration where two high-frequency oscillators are used.

Figure 7:
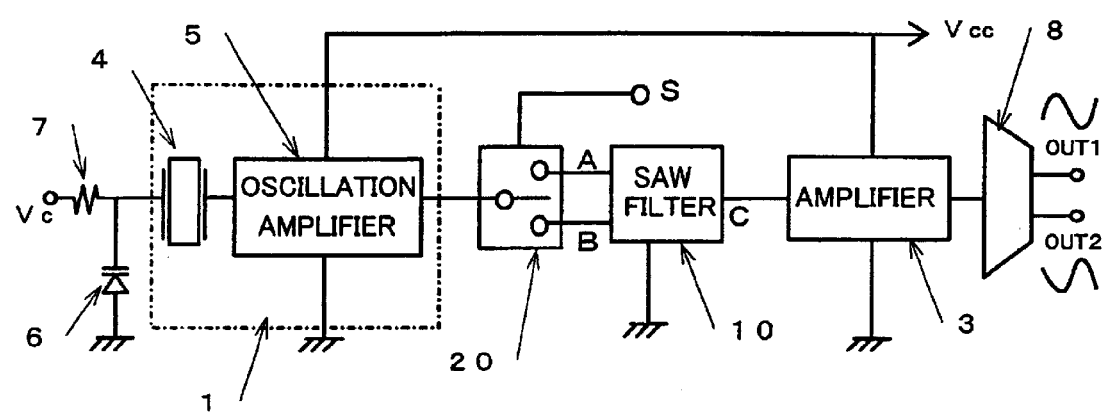
FIG. 7 is a circuit diagram showing the configuration of an oscillator of a frequency switching type according to a third preferred embodiment.

FIG. 7 is a circuit diagram showing the configuration of an oscillator of a frequency switching type according to the third preferred embodiment. In this figure, constituent elements that fundamentally have the same functions as those of the constituent elements shown in FIGS. 1 and 4 are denoted with the same reference numerals, and their explanations are simplified or omitted below.

The oscillator of a frequency switching type shown in FIG. 7 comprises one crystal oscillator 1.

This crystal oscillator 1 raises the levels of the harmonic components f2 to fn relatively to the fundamental component f1 of the frequency spectrum as shown in FIG. 3 by distorting the output. The SAW filter 10 is implemented by configuring a plurality of filters whose center frequencies of passbands are different on the same piezoelectric substrate shown in FIG. 5. The output from the crystal oscillator 1 is selected and input to the input end A or B within the SAW filter 10 by an input selection box 20 based on the switching signal S from the selection switching mechanism not shown. As a result, the signal of the frequency filtered by the filter having the selected input end is output from the output end C of the SAW filter 10. This output is amplified with the amplifier 3, so that complementary outputs OUT1 and OUT2 are obtained via the complementary-output driver IC 8.

In the oscillator of frequency switching type shown in FIG. 7, an oscillation frequency that can be output is determined according to the center frequencies of the passbands of the plurality of filters within the SAW filter 10. Note that, however, these center frequencies are limited to the fundamental component f1 or the harmonic components f2 to fn of the crystal oscillator 1.

Also with the oscillator of frequency switching type having the configuration shown in FIG. 7, an oscillation output of a desired frequency can be securely obtained by making a selection from among a plurality of oscillation frequencies. Additionally, this configuration requires only one crystal oscillator 1, whereby the device can be further reduced in size and cost in comparison with the configuration shown in FIG. 4.

According to the above described preferred embodiments, one of two frequencies is selected, and the selected frequency is output. However, the number of crystal oscillators 1 is increased (in the first and the second preferred embodiments), or the number of filters is increased (in the third preferred embodiments), so that a high frequency output can be obtained from among three or more frequencies.

Furthermore, an oscillation output is implemented as complementary outputs. However, it maybe implemented as one output. A high-frequency oscillator that selects and outputs one of a plurality of harmonic frequencies belongs to the technical scope of the present invention.

With the oscillator of a frequency switching type according to the present invention, any of a plurality of frequencies can be selected and output, and the device can be downsized.

What is claimed is:

1. A high-frequency oscillator of a frequency switching type, comprising:
   a plurality of crystal oscillation units whose fundamental frequencies of oscillation outputs are different;
   a power switching unit operating one of the plurality of crystal oscillation units; and a surface acoustic wave filter unit, which is configured by forming a plurality of interdigital transducers setting passbands of different frequencies on a same piezoelectric substrate, and the oscillation output of said crystal oscillation unit operated by said power switching unit is input thereto.

2. A high-frequency oscillator of a frequency switching type, comprising:

a plurality of crystal oscillation units whose fundamental frequencies of oscillation outputs are different;

a plurality of filter units which are respectively arranged for receiving corresponding oscillation outputs of said plurality of crystal oscillation units, and whose frequency passbands are different; and an output frequency selection unit selecting a frequency of a high-frequency output, which is output from the high-frequency oscillator.

3. The high-frequency oscillator of a frequency switching type according to claim 2, wherein said plurality of filter units are formed on a same piezoelectric substrate.

4. The high-frequency oscillator of a frequency switching type according to claim 3, wherein said plurality of filter units are a surface acoustic wave filter which is configured by forming a plurality of interdigital transducers setting passbands of different frequencies on the same piezoelectric substrate.

5. The high-frequency oscillator of a frequency switching type according to claim 2, wherein said output frequency selection unit selects a frequency of a high-frequency output, which is output from the high-frequency oscillator, by supplying a power line to one of said plurality of crystal oscillation units.

6. The high-frequency oscillator of a frequency switching type according to claim 2, wherein said plurality of crystal oscillation units distort and output the oscillation outputs.

7. A high-frequency oscillator of a frequency switching type, comprising:

a crystal oscillation unit distorting and outputting an oscillation output;

a plurality of filter units whose frequency passbands are respectively different; and an input selection unit selecting one of said plurality of filter units, and inputting the oscillation output thereto.

8. The high-frequency oscillator of a frequency switching type according to claim 7, wherein said plurality of filter units are formed on a same piezoelectric substrate.

9. The high-frequency oscillator of a frequency switching type according to claim 8, wherein said plurality of filter units are a surface acoustic wave filter which is configured by forming a plurality of interdigital transducers setting passbands of different frequencies on the same piezoelectric substrate.

10. A high-frequency oscillator of a frequency switching type, comprising:

a plurality of crystal oscillation means whose fundamental frequencies of oscillation outputs are different;

power line means for operating one of said plurality of crystal oscillation means; and surface acoustic wave filter means, which is configured by forming a plurality of interdigital transducers setting passbands of different frequencies on a same piezoelectric substrate, and the oscillation output of said crystal oscillation means operated by said power line means is input thereto.

11. A high-frequency oscillator of a frequency switching type, comprising:

a plurality of crystal oscillation means whose fundamental frequencies of oscillation outputs are different;

a plurality of filter means which are respectively arranged for receiving corresponding oscillation output of said plurality of crystal oscillation means, and whose frequency passbands are different; and output frequency selection means for selecting and outputting a frequency of a high-frequency output, which is output from the high-frequency oscillator.

12. A high-frequency oscillator of a frequency switching type, comprising:

crystal oscillation means for distorting and outputting an oscillation output;

a plurality of filter means whose frequency passbands are respectively different; and input selection means for selecting one of said plurality of filter means, and for inputting the oscillation output thereto.

13. A high-frequency oscillation method, comprising:

selecting one of oscillation outputs of a plurality of crystal oscillation units whose fundamental frequencies of the oscillation outputs are different; and inputting the selected oscillation output to a surface acoustic wave filter.

14. A high-frequency oscillation method, comprising:

distorting and outputting an oscillation output from an oscillation unit; and selecting one of a plurality of filter units whose frequency passbands are respectively different, and inputting the oscillation output thereto.

* * * * *